United States Patent [19]

Thompson

[11] 4,223,336
[45] Sep. 16, 1980

[54] LOW RESISTIVITY OHMIC CONTACTS FOR COMPOUND SEMICONDUCTOR DEVICES

[75] Inventor: James W. Thompson, Whitehouse Station, N.J.

[73] Assignee: Microwave Semiconductor Corp., Somerset, N.J.

[21] Appl. No.: 886,479

[22] Filed: Mar. 14, 1978

[51] Int. Cl.² .................. H01L 29/167; H01L 29/207; H01L 29/227
[52] U.S. Cl. ........................................ 357/63; 357/65; 357/68; 357/88; 357/89; 357/90
[58] Field of Search ....................... 357/63, 65, 68, 88, 357/89, 90

[56] References Cited

U.S. PATENT DOCUMENTS

| | | | |
|---|---|---|---|
| 3,687,743 | 8/1972 | Le Duc | 357/63 |
| 3,728,784 | 4/1973 | Schmidt | 357/63 |
| 3,793,094 | 2/1974 | Strack et al. | 357/63 |
| 3,836,999 | 9/1974 | Nishizawa | 357/63 |
| 3,863,334 | 2/1975 | Coleman | 357/63 |
| 3,941,624 | 3/1976 | Cho | 357/63 |
| 3,959,036 | 5/1976 | Ketchow | 357/63 |
| 4,008,485 | 2/1977 | Miyoshi et al. | 357/63 |
| 4,024,569 | 5/1977 | Hawryle et al. | 357/63 |
| 4,131,904 | 12/1978 | Ladany et al. | 357/63 |

*Primary Examiner*—Andrew J. James
*Attorney, Agent, or Firm*—Pennie & Edmonds

[57] ABSTRACT

Ohmic contacts having reduced resistivity and enhanced current-carrying capability are fabricated in compound semiconductor devices by substantially saturating the compound semiconductor with two different impurities of the same conductivity type, the different impurities being respectively suitable for occupying the two different types of impurity sites available in the compound semiconductor. The result is a sufficient increase in available carriers that conductivity takes place primarily through field emission tunneling and is enhanced to a degree wholly disproportionate to the increase in the number of available carriers.

8 Claims, 1 Drawing Figure

LOW RESISTIVITY OHMIC CONTACTS FOR COMPOUND SEMICONDUCTOR DEVICES

BACKGROUND OF THE INVENTION

1. Field Of The Invention

This invention relates to ohmic contacts for semiconductor devices and, in particular, to low resistivity contacts for compound semiconductor devices.

2. History Of The Art

In the fabrication of semiconductor devices, lead conducting wires are nearly always coupled to the semiconductor through an intervening layer of metal forming an ohmic (non-rectifying) contact with the semiconductor. In the typical fabrication of such a contact, the semiconductor to be contacted is doped to a high level of conductivity with a single impurity of one conductivity type (either n-type or p-type) and alloyed with a suitable metal. The metal chosen should (1) be capable of making a good ohmic contact; (2) be an excellent conductor; and (3) be metallurgically compatible with the lead conducting wires. Metals commonly used for ohmic contacts are aluminum, gold, nickel, lead, silver, and chromium.

In many applications, it is important that the ohmic contacts have as little resistivity as is possible. In microwave power transistors, for example, the contact resistance is an important factor limiting the frequency response.

In conventional ohmic contacts wherein an elemental or compound semiconductor is doped with only one impurity, the attainable conductivity is limited by the maximum concentration of that impurity which, in turn, is limited by the impurity solubility and partition coefficients. The use of two different impurities of the same conductivity type in an elemental semiconductor produces no appreciable reduction of resistivity because, in substance, the two different impurities are competing for the same impurity sites.

One approach for overcoming these limiting factors involves doping the semiconductor with two impurities of different respective impurity types. This approach is disclosed in applicant's copending application, Ser. No. 841,553 filed Oct. 11, 1977.

The present invention presents an alternative approach which avoids the necessity of using dopants of opposite conductivity type.

SUMMARY OF THE INVENTION

In accordance with the invention, ohmic contacts having reduced resistivity and enhanced current-carrying capability are fabricated in compound semiconductor devices by substantially saturating the compound semiconductor with two different impurities of the same conductivity type, the different impurities being respectively suitable for occupying the two different types of impurity sites available in the compound semiconductor. The result is a sufficient increase in available carriers that conductivity takes place primarily through field emission tunneling and is enhanced to a degree wholly disproportionate to the increase in the number of available carriers.

BRIEF DESCRIPTION OF THE DRAWING

The nature, advantages, and various additional features of the invention will appear more fully upon consideration of the illustrative embodiments now to be described in detail in connection with the accompanying drawing (FIG. 1) which is a schematic cross section of a semiconductor device having an improved ohmic contact in accordance with the invention.

DETAILED DESCRIPTION OF THE DRAWING

Figure 1:
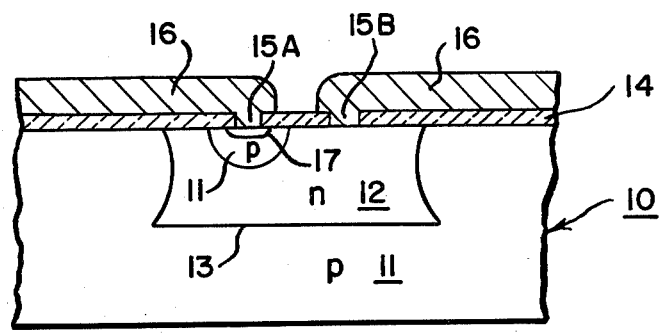

The drawing is a schematic cross section of an exemplary compound semiconductor device having an improved ohmic contact in accordance with the invention. The exemplary semiconductor device comprises a body 10 of compound semiconductor material, such as gallium arsenide, having regions of p-type conductivity 11 and n-type conductivity 12 and one or more p-n junctions 13 therebetween. Advantageously, the active surface of the device is protected by a passivating layer 14 such as glass. In the particular example of FIG. 1, the device is useful as a rectifying diode.

The semiconductor device includes one or more ohmic contacts generally denoted 15A and 15B, each of which comprises a layer 16 of conductive material, such as nickel, in contact with the semiconductor body and overlaying a semiconductor region of one conductivity type. In accordance with the invention, at least one of these ohmic contacts, e.g., 15A, includes, disposed between the conductive layer and the underlying semiconductor region, an intervening multiple-doped region 17 of the semiconductor body which is substantially saturated with a plurality of different impurities of the same conductivity type. The different impurities being respectively suitable for occupying the different types of impurity sites available in the compound semiconductor. Typically these impurities are of the same conductivity type as the dopant of the underlying semiconductor. The net carrier concentration is the sum of the carrier concentrations of the two dopants.

In compound semiconductors having metal and non-metal components, one p-type dopant can be an element which has one less or fewer valence electrons than the non-metal component of the semiconductor for which it is substituted. The other p-type dopant can be an element having one less or fewer valence electrons than the metal component for which it is substituted. Thus, for example, in III–V compound semiconductors, in order to produce p-type contacts, Group IV dopants can be substituted for the Group V semiconductor atoms, and Group II dopants can be substituted for the Group III atoms. In the specific case of p-type gallium arsenide devices, the Group IV dopants can be chosen from among silicon, germanium, or tin, and the Group II dopants can be chosen from among zinc, cadmium, or magnesium.

The concentrations of the two dopants are chosen to substantially saturate the semiconductor with each dopant. Specifically, the concentration of each dopant should exceed about 75% of the maximum concentration of that dopant in the semiconductor. In the aforementioned case of gallium arsenide, the concentration of each dopant should preferably exceed about $5 \times 10^{18}$ atoms per cubic centimeter so that the net carrier concentration exceeds about $10 \times 10^{18}$ atoms per cubic centimeter.

Alternatively, for n-type contacts to compound semiconductors, one n-type dopant can be an element having one or more additional valence electrons than the non-metal component of the semiconductor for which it is substituted. The other n-type dopant can be an element having one or more additional valence electrons than the metal component for which it is substituted.

For example, in III–IV compound semiconductors, Group VI dopants can be substituted for Group V semiconductor components, and Group IV dopants can be substituted for Group III semiconductor components to produce n-type ohmic contacts. For n-type gallium arsenide, the Group VI dopants can be chosen from among sulfur, selenium, or tellurium, and the Group IV dopants can be chosen from among silicon, germanium, or tin.

The concentrations of the two dopants are chosen to substantially saturate the semiconductor with each dopant and should exceed about 75% of the respective maximum concentrations. In gallium arsenide the concentration of each dopant should preferably exceed about $5 \times 10^{18}$ atoms per cubic centimeter.

The primary advantage of ohmic contacts thus structured is that the high concentrations of carriers reduce the thickness of the space charge region between the metal and the semiconductor to such a degree that a large number of carriers can tunnel through the barrier. As a consequence, conductivity takes place primarily through field emission tunneling and is enhanced to a degree wholly disproportionate to the increase in the number of available carriers. Experiments indicate that ohmic contacts in accordance with the invention have conductivities enhanced by as much as a factor of 5 as compared to typical conventional ohmic contacts.

In fabricating a semiconductor device having ohmic contact 15A in accordance with the invention, the p-type regions 11 and n-type regions 12 and p-n junctions 13 are formed in the compound semiconductor body 10 by conventional bipolar processing techniques. The active surface of the body is then masked, as by passivating layer 14, with an opening cut where ohmic contacts to regions of a given type of conductivity are desired. The dual doped region 17 is formed as by saturation doping p-type gallium arsenide with silicon and zinc.

After the double-doped region has been formed, a metal layer is deposited by standard metallization techniques, such as vacuum evaporation, and photoetched to define contact 14. The metal may then be alloyed to the surface of the semiconductor, if desired, by heating to a temperature in excess of the eutectic temperature.

Ohmic contact 15B can be fabricated as a conventional ohmic contact.

In the fabrication of this p-type ohmic contact, the conditions of epitaxial growth, annealing, and diffusion should be controlled in accordance with principles well-known in the art so that the silicon dopant will seek out the arsenic site rather than the gallium site. This can be accomplished, for example, by low temperature liquid epitaxial growth.

N-type ohmic contacts in accordance with the invention can be formed by an analogous process except that the conditions are controlled so that the silicon dopant will seek out the gallium site rather than the arsenic site. This can be accomplished by vapor epitaxial growth or high temperature liquid epitaxial growth.

While the invention has been described in connection with but a small number of specific embodiments, it is to be understood that these are merely illustrative of the many other specific embodiments which can also utilize the principles of the invention. For example, this multiple dopant approach can work on any compound semiconductor which has a plurality of types of doping sites and is applicable not only to binary semiconductors but also to ternary and quaternary compound semiconductors. Moreover, it is useful not only in diodes but in wide classes of electronic devices, such as microwave devices, lasers, and solar cells, which require ohmic contacts. Thus, numerous and varied devices and methods can be made by those skilled in the art without departing from the spirit and scope of the invention.

I claim:

1. An ohmic contact for providing non-rectifying contact with a body of a compound semiconductor material capable of accepting a plurality of different dopants at different respective sites, said contact comprising:
   a layer of conductive material disposed in contact with said compound semiconductor body overlying a region of one type of conductivity;
   disposed between said layer of conductive material and said region, an intervening layer doped substantially to saturation with each of a plurality of different dopants of the same conductivity type, said different dopants being suitable for occupying respectively different sites available in said compound semiconductor.

2. A device according to claim 1 wherein each of said dopants is doped to a concentration in excess of 75% of its maximum concentration in said semiconductor.

3. A device according to claim 1 wherein said compound semiconductor is an n-type compound semiconductor comprising a group III component and a group V component and wherein said plurality of different dopants comprise a group VI dopant substituted for group V components and a group IV dopant substituted for group III components.

4. A device according to claim 3 wherein said compound semiconductor is gallium arsenide; said group VI dopant is chosen from among sulfur, selenium or tellurium; and said group IV dopant is chosen from among silicon, germanium or tin.

5. A device according to claim 3 wherein each of said plurality of dopants has a concentration in excess of about $10 \times 10^{18}$ atoms per cubic centimeter.

6. A device according to claim 1 wherein said compound semiconductor is a p-type compound semiconductor comprising a group III component and a group V component and wherein said plurality of different dopants comprise a group IV dopant substituted for group V components and a group II dopant substituted for group III components.

7. A device according to claim 7 wherein said compound semiconductor is p-type gallium arsenide; said group IV dopant is chosen from among silicon, germanium or tin; and said group II dopant is chosen from among zinc, cadmium or magnesium.

8. A device according to claim 7 wherein each of said plurality of dopants has a concentration in excess of about $10 \times 10^{18}$ atoms per cubic centimeter.

* * * * *